United States Patent
Innes et al.

(10) Patent No.: US 6,326,635 B1
(45) Date of Patent: Dec. 4, 2001

(54) MINIMIZATION OF ELECTRON FOGGING IN ELECTRON BEAM LITHOGRAPHY

(75) Inventors: Robert Innes, Richmond; Lee H. Veneklasen, Castro Valley; Allan L. Sagle, Berkeley; Sergey Babin, Castro Valley; Chen Hwa, Fremont, all of CA (US)

(73) Assignee: Etec Systems, Inc., Hayward, CA (US)

( * ) Notice: Subject to any disclaimer, the term of this patent is extended or adjusted under 35 U.S.C. 154(b) by 0 days.

(21) Appl. No.: 09/365,589

(22) Filed: Jul. 30, 1999

(51) Int. Cl.$^7$ .................................................. H01J 37/09
(52) U.S. Cl. ........................................ 250/505.1; 250/310
(58) Field of Search ............................ 250/492.2, 505.1, 250/515.1, 310, 398

(56) References Cited

U.S. PATENT DOCUMENTS

| | | | |
|---|---|---|---|
| 3,801,792 | 4/1974 | Lin | 250/398 |
| 4,508,967 | 4/1985 | Boissel et al. | 250/396 |
| 4,976,843 | 12/1990 | Ward et al. | 204/298 |
| 5,838,006 | 11/1998 | Veneklasen et al. | 250/310 |
| 6,172,364 | * 1/2001 | Ogasawara et al. | 250/505 |

OTHER PUBLICATIONS

*Electron, ION and Photon Beam Technology and Nanofabrication* Conference Sponsored by The American Vacuum Society, Marriott Resort Marco Island, Florida, Jun. 1–4, 1999 pp 59,60.

\* cited by examiner

Primary Examiner—Kiet T. Nguyen
(74) Attorney, Agent, or Firm—Greg Leitich

(57) ABSTRACT

A shield assembly for reducing electron fogging effects in electron beam lithography. This shield, located between an electron beam column final aperture and the beam target, is of multiple vanes with sharp edges pointing towards the electron beam incident point on the target; the vanes are conically shaped and concentric around the electron beam path, which travels through the center of the assembly. Additionally, the sharp edges are such that they present oblique surfaces at the ends of the vanes angled between 10° and 20° relative to the outer vane surface and these oblique surfaces face towards the electron beam path. Furthermore, the shield assembly may also have the vanes angled towards the beam incident point such that the vertex of the conical vane assembly is coincident with the beam incident point.

14 Claims, 3 Drawing Sheets

MINIMIZATION OF ELECTRON FOGGING IN ELECTRON BEAM LITHOGRAPHY

BACKGROUND

1. Field of the Invention

This invention relates to electron beam lithography and particularly to reduction of electron double back scattering.

2. Description of Related Art

Electron beam lithography typically uses electrons accelerated in vacuum to expose a resist by penetrating the resist layer. These electrons are usually stopped by the resist or underlying substrate; however, some of them are scattered back by the resist or its substrate into the surrounding vacuum where they strike the accelerating column components, workchamber cover, or other components. Some of these scattered electrons then reflect back onto the resist where they degrade the image clarity by producing a fogging effect. Several known techniques minimize this fogging. One such technique utilizes materials with low densities and low atomic numbers in the construction of the components surrounding the resist and its substrate. These materials are usually effective in preventing electron "bounce-back" (reflection) by absorbing the scattered electrons. Another technique locates chambers above the resist and its substrate. A chamber has a window which allows electrons to enter and a deep interior from which a scattered electron has little probability of finding its way out of the window it entered. Electrons entering the chamber are usually absorbed by the chamber material. The chamber walls typically extend closely towards the point of where the electrons initially are incident on the resist. They are also formed by vanes such that the chambers have small openings. Although these chambers are effective in reducing the total energy of the fogging electrons, they can actually intensify the fogging effect close to the point of electron incidence on the resist due to back-scattered electrons reflecting off blunt edges of the vanes close to the resist. Therefore, there is a need not only to reduce the total energy of the fogging electrons, but to also reduce the intensified fogging effect produced by electrons reflecting off the blunt edges of the vanes of the chamber walls.

SUMMARY

In accordance with the invention, the above problem is overcome by use of an electron shield assembly having multiple vanes with sharp edges pointing towards the electron beam incident point on the resist. These vanes are in conically shaped assemblies and concentric about the electron beam path, which extends through the center of the assembly. The vanes have lower sharp edges due to oblique surfaces at the ends of the vanes angled between 10° and 20° relative to the outer vane surface and facing towards the electron beam path. Additionally, the shield assembly may also have the vanes angled towards the electron beam incident point such that the vertex of the cone-shaped vane assemblies is coincident with the beam incident point.

BRIEF DESCRIPTION OF THE DRAWINGS

FIG. 2A shows a side view of the present shield assembly while

Use of the same reference symbols in different figures indicates similar or identical items.

DETAILED DESCRIPTION

Figure 1:
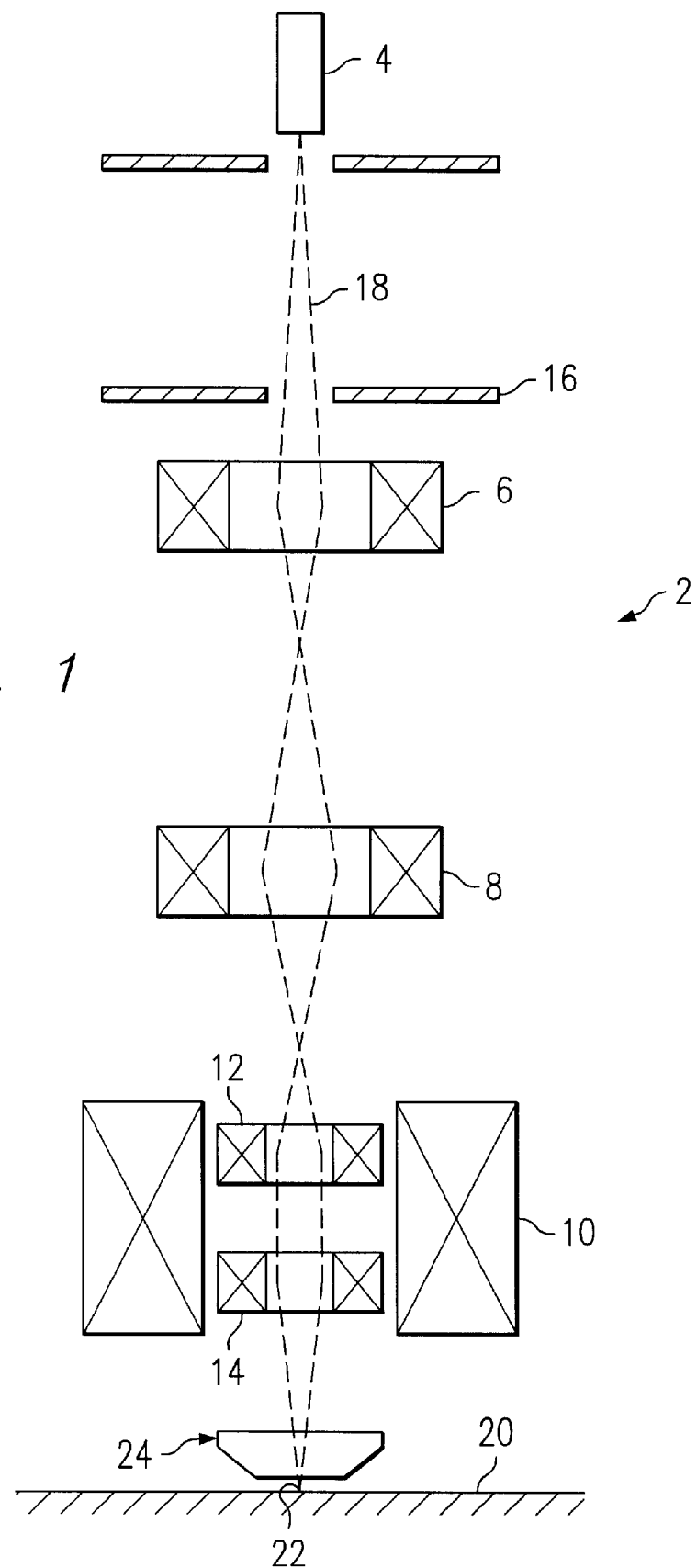
FIG. 1 shows a diagram of an electron beam column and the location of the present shield assembly at the lower part of the objective lens assembly.

FIG. 1 illustrates in a side view an electron beam column 2 which is conventional except for the addition of shield assembly 24. Such electron beam columns are typically used in applications such as electron beam lithography, e.g., for forming images on resist on a wafer or reticle in the semiconductor industry, and they include multiple components. In electron beam applications the term "lens" refers to a magnetic coil or electrostatic device and not lenses as used in light optics. Electron beam 18 is generated by electron gun 4; traveling through electron beam column 2, beam 18 first passes through aperture 16 and then passes through first condenser lens 6. Electron beam 18 usually then crosses over before it passes through second condenser lens 8. Beam 18 then crosses over again before first passing through objective lens assembly 10. While passing through objective lens assembly 10, electron beam 18 passes upper deflection coil 12 and lower deflection coil 14. The support structures, vacuum housing, and electrical, cooling, and vacuum connections, which are all conventional, are not illustrated for simplicity.

In one embodiment, shield assembly 24 is located at the lower portion of electron beam column 2 and just above the resist-bearing substrate 20 (e.g., a semiconductor wafer or reticle blank). Electron beam 18 passes through shield assembly 24 before striking resist substrate 20 at incident point 22. The energy of the electrons from electron gun 4 in one embodiment is 50 keV, but it may vary in other embodiments over a range, e.g., 10 to 100 keV. Additionally, micro-columns (small-diameter electron beam columns) utilize shield assembly 24 in another embodiment.

Figure 2A:
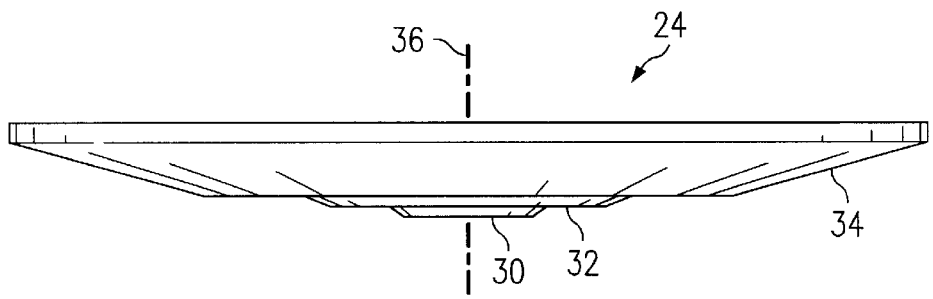
Figure 2B:
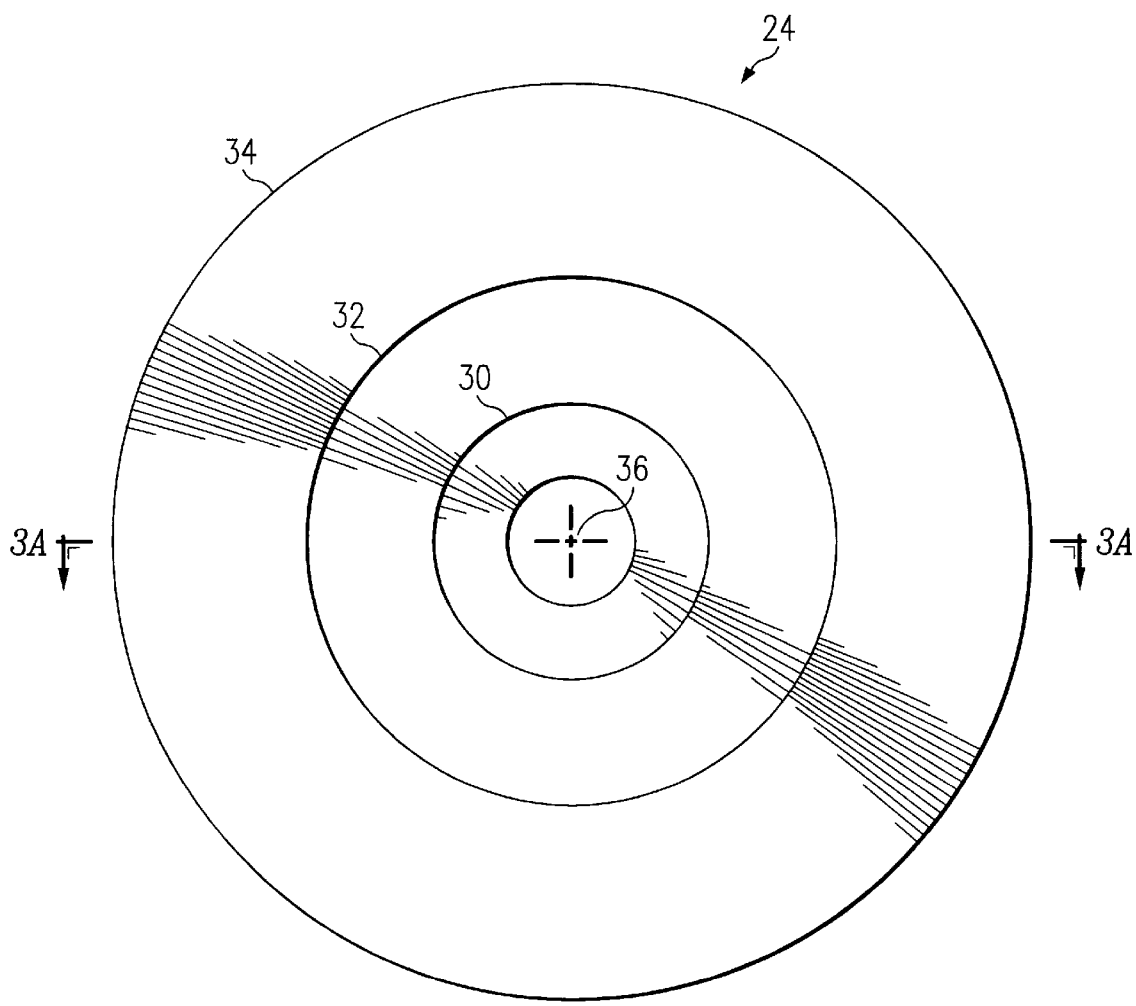
FIG. 2B shows a bottom view.

FIG. 2A shows a side view of shield assembly 24 while FIG. 2B shows a bottom view. In one embodiment shield assembly 24 includes several circular baffles, including inner baffle 30, outer baffle 32, and shield base 34. These circular baffles each include individual conically shaped vanes such that inner baffle 30 lies within outer baffle 32 and both lie within shield base 34. Additionally, because these baffles are conically shaped and concentric, each shares a common shield assembly axis 36 which lies through the center of shield assembly 24 and which also defines a path for electron beam 18 through shield assembly 24.

Figure 3A:
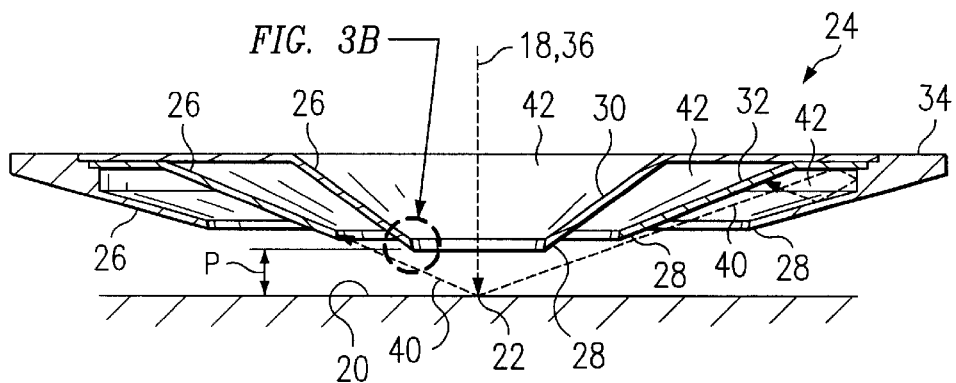
FIG. 3A shows a cross sectioned view (Section A—A) taken from FIG. 2B.

FIG. 3A shows a cross sectional view (along section A—A) taken from FIG. 2B. Baffles 30, 32, 34 form an inverted cone shape such that outer baffle 32 lies within shield base 34, and inner baffle 30 also lies with shield base 34 and on top of outer baffle 32. Individual baffles 30, 32 may be fastened onto shield base 34 with an adhesive or attached together by any suitable method. Assembly is by conventional techniques. Moreover, baffles 30, 32, 34 each include mulitple vanes 26 which form the cone walls. These vanes are at an angle such that the vertices of the individual cones are collinear with shield assembly axis 36 in one embodiment. Vanes 26 have a thickness t which varies according to the shield assembly material. Shield assembly 24 minimizes electron fogging effects from back-scattered electrons which initially reflect from substrate 20 then reflect again off blunt edges of shield assembly 24 and then back down to substrate 20. The vanes of shield assembly 24 in one embodiment are made of a low density material also having a low atomic number. Exemplary materials include beryllium, titanium, and carbon based materials to aid in the absorption of scattered electrons 40. In one embodiment a typical vane has a minimum thickness t of 0.003 inches. Vanes 26 having thickness t define parallel walls forming the inner and outer surfaces of the cone. Vanes 26 have lower sharp ends 28 which terminate with a subtended acute angle.

Having vanes with lower sharp ends 28 not only reduces the overall electron fogging but it greatly reduces the electron fogging at incident point 22, where fogging may actually be intensified because of the proximity of shield assembly 24 and scattered electrons 40 reflected back to substrate 20 from blunt edges of vanes 26.

The reduction in electron fogging energy can be calculated by a conventional Monte Carlo simulation program to statistically generate electron scattering results for shield assembly 24. As electron beam 18 passes through shield assembly axis 36, it strikes substrate 20 at incident point 22. In one embodiment the bottom of shield assembly 24 is at a distance p (0.050 inches) above the surface of substrate 20. This results in most of electron beam 18 being absorbed into the resist on substrate 20, but also results in scattered electrons 40 that are reflected back towards shield assembly 24. Scattered electrons 40 typically bounce back into concentrically formed chambers 42 between vanes 26. When within chambers 42, scattered electrons 40 are further scattered by the vane walls with little chance of exiting chambers 42 or they are absorbed by the vanes 26 which are preferably of materials of low density and low atomic number. As is well known, electron absorption is governed by Rutherford scattering, secondary electron generation, and Bethe energy loss. Lower sharp vane ends 28 not only present a smaller area from which scattered electrons 40 may reflect back down to substrate 20, but they also aid in deflecting electrons 40 into chambers 42 where electrons 40 are likely to be absorbed; they also present inner oblique surfaces 38 (see FIG. 3B) where electrons 40 can be absorbed into the material of vanes 26.

Figure 3B:
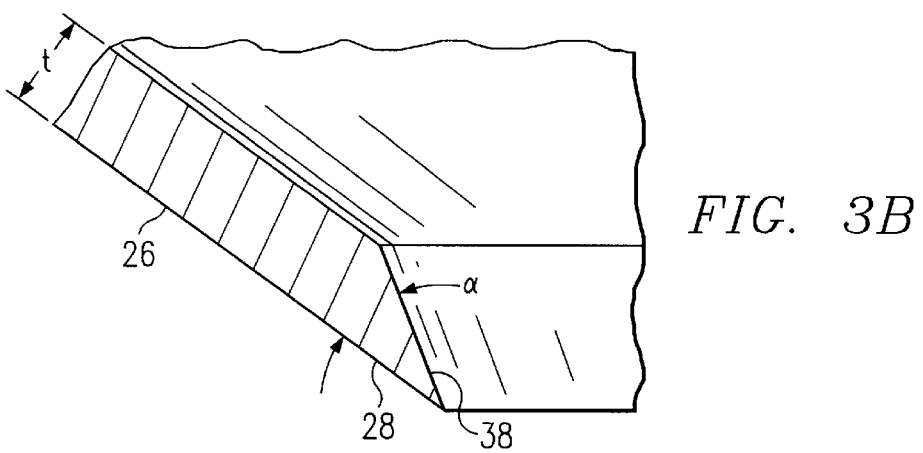
FIG. 3B shows a view of Detail A taken from FIG. 3A illustrating the lower sharpened end on each of the vanes.

FIG. 3B shows a view of Detail A taken from FIG. 3A illustrating lower sharp end 28 on one of vanes 26. Lower sharp end 28 is the edge of vane 26 with acute angle α. In one embodiment, angle α is formed by inner oblique surface 38 and the outer surface of vane 26; angle α is preferably between 10° and 20°. This results in having inner oblique surface 38 facing towards shield assembly axis 36.

Figure 4:
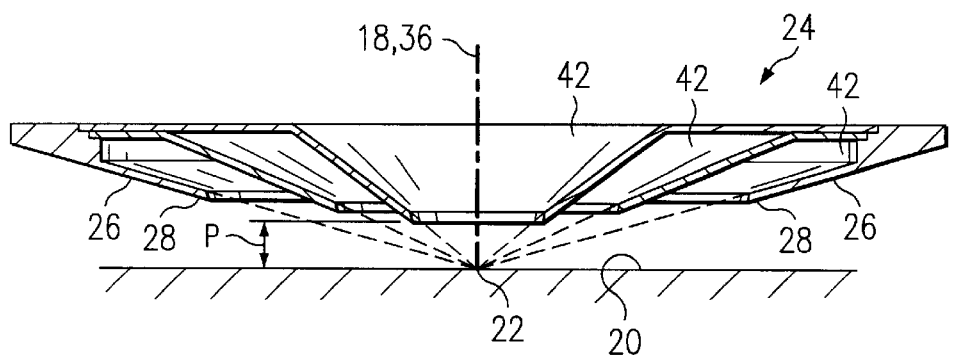
FIG. 4 shows the shield assembly having the vanes directed at the incident point.

FIG. 4 shows another embodiment of shield assembly 24, with the additional feature of vanes 26 pointing at incident point 22. This requires that vanes 26 of inner baffle 30, outer baffle 32, and shield base 34, which are all cone shaped, have their respective vertices coincident with incident point 22 as shown. This downwardly angled configuration presents the minimum area for vanes 26 and lower sharp ends 28 for scattered electrons 40 to reflect back down to substrate 20.

Although the invention has been described with reference to particular embodiments, the description is only an example of the invention's application and should not be taken as a limitation. In particular, even though much of the preceding discussion has included an inner baffle 30, outer baffle 32, shield base 34 and lower sharp ends 28 having specified angles, alternative embodiments of this invention include various other vane and baffle configurations as well as varying vane sharp ends. Various other adaptations and combinations of features of the embodiments disclosed are within the scope of the invention as defined by the following claims.

We claim:

1. An electron shield disposed in an electron beam column between a target of an electron beam and an electron gun generating said electron beam and being concentric to an axis of said electron beam, said shield comprising a plurality of conically shaped vanes disposed concentrically about said electron beam axis, wherein said vanes point towards said axis and each of said vanes further comprises a sharp end adjacent said target.

2. The shield of claim 1, wherein said vanes each has a thickness no less than about 0.003 inches.

3. The shield of claim 1, wherein said vanes define a plurality of concentric chambers.

4. The shield of claim 1, wherein said vanes are of a material having a low density and a low atomic number.

5. The shield of claim 4, wherein said material is selected from the group consisting of beryllium, titanium and carbon.

6. The shield of claim 1, wherein said electron beam is incident on said target at a target point coincident with said axis and said vanes each points towards said target point.

7. An electron shield disposed in an electron beam column between a target of an electron beam and an electron gun generating said electron beam and being concentric to an axis of said electron beam, said shield comprising a plurality of conically shaped vanes disposed concentrically about said electron beam axis, wherein said vanes point towards said axis and each of said vanes further comprises a sharp end adjacent said target, wherein each said sharp end has an inner oblique surface facing towards said axis such that said inner oblique surface and an opposing outer vane surface define an angle no greater than about 20 degrees.

8. A method of providing shielding within an electron beam column, comprising:

directing in said column a beam of electrons onto a target;

deflecting electrons reflected from said target with a plurality of generally concentric vanes having sharp ends adjacent said target; and absorbing said reflected electrons in said vanes.

9. The method of claim 8, wherein said plurality of vanes each has a thickness no less than about 0.003 inches.

10. The method of claim 8, wherein said plurality of vanes define a plurality of concentric chambers.

11. The method of claim 8, wherein said vanes are of a material having a low density and a low atomic number.

12. The method of claim 11, wherein said material is selected from the group consisting of beryllium, titanium, and carbon.

13. A method of providing shielding within an electron beam column, comprising:

directing in said column a beam of electrons onto a target;

deflecting electrons reflected from said target with a plurality of vanes having sharp ends adjacent said target; and absorbing said reflected electrons in said vanes, wherein said vanes each has an inner oblique surface facing towards an axis of said electron beam such that said inner oblique surface and an opposing outer vane surface define an angle measuring no greater than bout 20 degrees.

14. An electron beam column, comprising:

an electron gun for generating an electron beam; and an electron beam shield adapted to receive an electron beam emitted from said electron gun, the electron beam shield comprising a plurality of substantially concentric, generally cone-shaped baffles having vanes forming cone walls, wherein gaps between said vanes form generally concentric chambers.

* * * * *